United States Patent
Kim

(10) Patent No.: US 8,458,531 B2
(45) Date of Patent: Jun. 4, 2013

(54) NON-VOLATILE MEMORY CARD APPARATUS AND METHOD FOR UPDATING MEMORY CAPACITY INFORMATION

(75) Inventor: Gwang-Myung Kim, Suwon-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 1978 days.

(21) Appl. No.: 11/378,206

(22) Filed: Mar. 20, 2006

(65) Prior Publication Data

US 2007/0011395 A1 Jan. 11, 2007

(30) Foreign Application Priority Data

Jul. 11, 2005 (KP) .................. 10-2005-0062000

(51) Int. Cl.
*G06F 11/00* (2006.01)
(52) U.S. Cl.
USPC .......................................... 714/54
(58) Field of Classification Search
USPC .................................. 714/54, 718
See application file for complete search history.

(56) References Cited

U.S. PATENT DOCUMENTS

| | | | |
|---|---|---|---|
| 2004/0225860 A1 | 11/2004 | Ahvenainen et al. | |
| 2006/0069898 A1* | 3/2006 | Patel et al. | 711/171 |
| 2006/0072157 A1* | 4/2006 | Hodder | 358/1.16 |
| 2007/0067684 A1* | 3/2007 | Stolero et al. | 714/718 |

FOREIGN PATENT DOCUMENTS

| | | |
|---|---|---|
| GB | 2304428 | 3/1997 |
| JP | 5314020 | 11/1993 |
| JP | 8190510 | 7/1996 |
| JP | 2003 216507 | 7/2003 |
| KR | 1020040038713 | 5/2004 |
| KR | 1020040052412 | 6/2004 |

OTHER PUBLICATIONS

English Abstract for Publication No. 5314020.
English Abstract for Publication No. 8190510.
English Abstract for Publication No. 2003-216507.
Office Action dated May 17, 2010 for German Patent Application No. 10200602295932.

\* cited by examiner

*Primary Examiner* — Scott Baderman
*Assistant Examiner* — Jigar Patel
(74) *Attorney, Agent, or Firm* — F. Chau & Associates, LLC

(57) ABSTRACT

A memory card apparatus includes a non-volatile memory and a controller configured to control the non-volatile memory and communicating with the host device, wherein the controller updates available memory capacity information according to occurrence of bad memory in the non-volatile memory and transmits the updated memory capacity information to a host device.

22 Claims, 5 Drawing Sheets

FIG. 5

| Name | Field | Width |
|---|---|---|
| CSD structure | CSD_STRucTure | 2 |
| System specification version | SPEC_VERS | 4 |
| ... | ... | ... |
| Max. read data block length | READ_BL_LEN | 4 |
| ... | ... | ... |
| Device size | C_SIZE | 12 |
| Device size multiplier | C_SIZE_MULT | 3 |
| ... | ... | ... |

NON-VOLATILE MEMORY CARD APPARATUS AND METHOD FOR UPDATING MEMORY CAPACITY INFORMATION

CROSS-REFERENCE TO RELATED PATENT APPLICATIONS

This application claims priority to Korean Patent Application No. 10-2005-0062000, filed on Jul. 11, 2005, the disclosure of which is herein incorporated by reference in its entirety.

BACKGROUND OF THE INVENTION

1. Technical Field

The present invention relates to a memory card apparatus and, more particularly, to a non-volatile memory card apparatus and a method of updating memory capacity information of a memory card apparatus.

2. Description of the Related Art

A memory card apparatus is commonly used in digital cameras, personal digital assistants, mobile phones, MP3 players and other host electronic devices that require a non-volatile read write memory for the storage of large amounts of data.

The host electronic device reads/writes data on the memory card. Recently, flash memory has become widely used for the memory card apparatus. In particular, NAND flash memory, which is less expensive than NOR flash memory, is widely used for the memory card apparatus.

The host device requests card capacity (i.e., memory capacity) information from the memory card apparatus such as when the memory card apparatus is connected thereto or when necessary. In response to the request, the memory card apparatus transmits the memory capacity information to the host device. Typically, the memory capacity information is stored in a register together with other information and the memory card apparatus transmits a register value to the host device.

The memory used in a memory card typically includes a plurality of memory blocks. Bad memory block may be encountered during a read or write operation. For example, a block may be determined to be bad in NAND type flash memory used for a memory card such as a multimedia card (MMC) or a secure digital (SD) card.

Conventional technology focuses on storing the position of a bad memory block and removing the bad memory block from the pool of available free memory blocks. However, information regarding the capacity of bad memory blocks such as a ratio of the capacity of bad memory blocks to a total capacity is not provided.

In the conventional technology, the memory capacity information that the memory card apparatus provides to the host device is total memory capacity information that does not reflect the occurrence of the bad memory blocks and has a fixed value. Accordingly, the host device can recognize the total capacity of the memory card apparatus but cannot recognize an actual available memory capacity excluding the bad memory blocks.

SUMMARY OF THE INVENTION

Exemplary embodiments of the present invention provide a memory card apparatus and method of updating memory capacity information of a memory card apparatus.

According to an exemplary embodiment of the present invention, a memory card apparatus includes a non-volatile memory, and a controller configured to control the non-volatile memory and to communicate with a host device, wherein the controller updates available memory capacity information according to occurrence of bad memory in the non-volatile memory and transmits the updated available memory capacity information to the host device. The non-volatile memory may be NAND type flash memory, and the updated available memory capacity information may be stored in a predetermined card-specific data (CSD) register included in the controller.

According to another exemplary embodiment of the present invention, a memory card apparatus comprises a NAND type flash memory including a plurality of memory blocks, and a controller transmitting capacity information of the NAND type flash memory to a host device in response to a request of the host device, wherein the controller updates bad memory capacity information according to occurrence of bad memory block(s) in the NAND type flash memory and reflects the updated bad memory capacity information in the capacity information of the NAND type flash memory. The capacity information of the NAND type flash memory may be data indicating an available memory capacity obtained by subtracting an unavailable memory capacity from a total capacity of the NAND type flash memory, and the unavailable memory capacity may be a sum of a controller allocation memory capacity and a bad memory capacity.

According to an exemplary embodiment of the present invention, there is provided a method of updating memory capacity information of a non-volatile memory card apparatus. The method includes updating bad memory capacity information according to occurrence of bad memory blocks in a non-volatile memory included in the non-volatile memory card apparatus, calculating memory capacity information of the non-volatile memory reflecting the bad memory capacity information, and providing the memory capacity information of the non-volatile memory to a host device.

According to another exemplary embodiment of the present invention, there is provided a method of updating memory capacity information of a memory card apparatus including NAND type flash memory and a controller. The method includes updating bad memory capacity information according to occurrence of bad memory blocks in the NAND type flash memory, calculating capacity information of the NAND type flash memory using the updated bad memory capacity information, updating a CSD register value using the capacity information of the NAND type flash memory, and transmitting the updated CSD register value to the host device.

According to an exemplary embodiment of the present invention, a system for updating memory capacity includes a host device, and a memory card apparatus connected to the host device, wherein the memory card apparatus comprises a non-volatile memory including a plurality of memory blocks, and a controller updating capacity information of the non-volatile memory according to occurrence of bad memory block(s) in the non-volatile memory and transmitting the updated capacity information to the host in response to a request of the host device.

BRIEF DESCRIPTION OF THE DRAWINGS

The present invention will become more apparent to those of ordinary skill in the art when descriptions of exemplary embodiments thereof are read with reference to the accompanying drawings.

FIG. 5 is a diagram of a card-specific data (CSD) register according to an exemplary embodiment of the present invention.

DETAILED DESCRIPTION OF EXEMPLARY EMBODIMENTS

Figure 1:
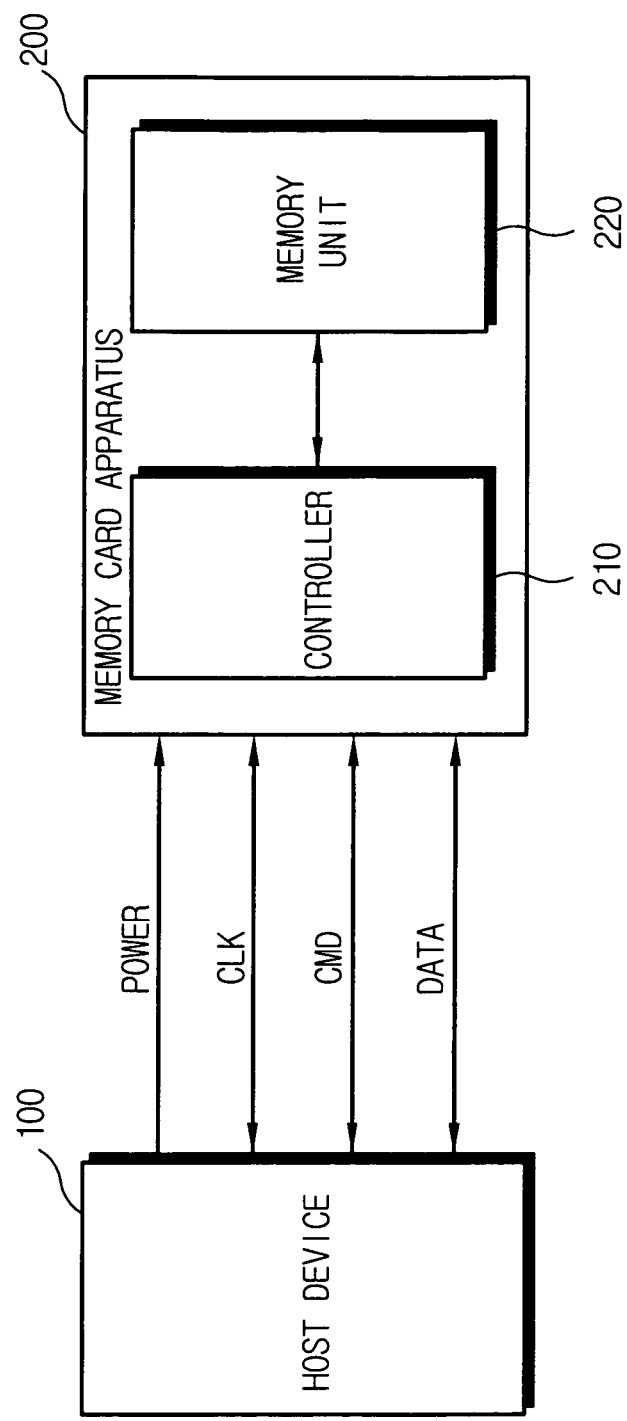
FIG. 1 is a schematic block diagram of a memory card apparatus according to an exemplary embodiment of the present invention.

Hereinafter, exemplary embodiments of the present invention will be described in detail with reference to the accompanying drawings. Like reference numerals refer to similar or identical elements throughout the description of the figures.

FIG. 1 is a schematic block diagram of a memory card apparatus 200 according to an exemplary embodiment of the present invention. In addition, FIG. 1 shows the relationship between the memory card apparatus 200 and a host device 100 connected to the memory card apparatus 200. Referring to FIG. 1, the memory card apparatus 200 includes a controller 210 and a memory unit 220.

The memory unit 220 is a non-volatile memory device, for example, a NAND type flash memory device. A bad block which is not to be used due to device characteristics may occur in NAND flash memory. Bad blocks may be encountered when the memory device is manufactured and tested or during the use of the memory device. In either case, the bad block(s) cannot be used.

The controller 210 controls the memory unit 220 and interfaces with the host device 100. The memory card apparatus 200 is connected to the host device 100 for use. The host device 100 may be an electronic/communication device such as a mobile phone, a personal digital assistant (PDA), or an MP3 player which requires memory for the storage of data. The memory card apparatus 200 includes a plurality of pins for connection with the host device 100. As shown in FIG. 1, the memory card apparatus 200 sends and receives a clock signal CLK, a command CMD, and data DATA to and from the host device 100, and is provided with power through the plurality of pins.

Figure 2:
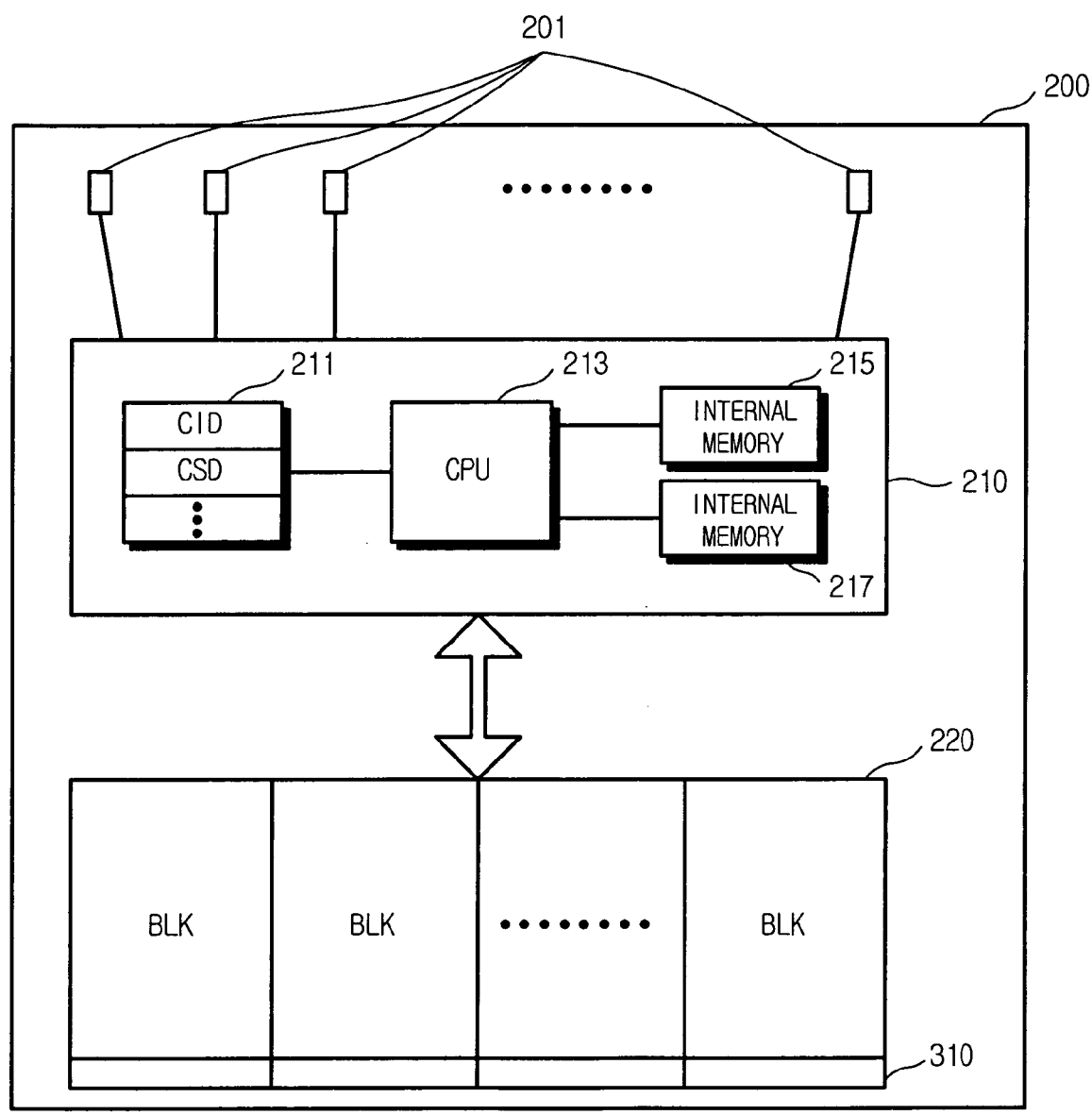
FIG. 2 is a block diagram illustrating the detailed internal structure of the memory card apparatus show in FIG. 1.

FIG. 2 is a block diagram illustrating the detailed internal structure of the memory card apparatus 200 shown in FIG. 1. The memory unit 220 includes a plurality of memory blocks BLK. The memory unit 220 may further include an interface unit (not shown) interfacing with the controller 210. Each memory block BLK may include a plurality of pages, for example, 64 pages.

The memory unit 220 includes a badness marking portion 310. The badness mark portion 310 is commonly referred to as a spare area and is included in each page. The badness mark portion 310 is used to mark whether a memory block BLK including a relevant page is bad. In a method of marking that a relevant memory block BLK is a bad memory block, the badness mark portion 310 corresponding to a particular page (e.g., a first or second page) among a plurality of pages included in the bad memory block may mark that the memory block BLK is bad. This method is good for marking a bad memory block occurring during manufacturing. With respect to a bad memory block occurring during use, the badness mark portion 310 corresponding to a particular page may be marked as described above, or information on the bad memory block may be stored in a particular memory area (e.g., a controller allocation memory block that will be described below), or both of the methods may be used. The badness mark portion 310 may be further used for other purposes in addition to a purpose of marking badness of each memory block BLK.

The memory blocks BLK may be used to store external data or may be used by the controller 210 for a particular purpose. A memory block (hereinafter, referred to as a controller allocation memory block) that is allocated by the controller 210 for the particular purpose cannot be used by the external host device 100. The memory blocks BLK that the external host device 100 can use are calculated by subtracting controller allocation memory block(s) and bad memory block(s) from total memory blocks BLK.

The controller 210 includes a central processing unit (CPU) 213, a plurality of registers 211, a first internal memory 215, and a second internal memory 217. As shown in FIG. 2, the plurality of registers 211 include a card-specific data (CSD) register and a card identification (CID) register.

The CID register stores card identification information such as a manufacture ID (MID), an OEM/application ID (OID), a product name (PNM), and a product serial number (PSN). The CSD register stores information such as a data format, an error correction type, a maximum data access time, and a data transmission rate that are needed to access card data.

FIG. 5 is a detailed diagram of the CSD register according to an exemplary embodiment of the present invention. Referring to FIG. 5, the names, fields, and widths of several of the parameters included in the CSD register are listed. It will be understood that additional parameters (not shown in FIG. 5) may be included in the CSD register. Among the parameters shown in FIG. 5, a parameter indicating card capacity information (i.e., memory capacity information) is C_SIZE. In the conventional technology, a C_SIZE field stores total memory capacity information that does not reflect bad memory capacity information. However, in an exemplary embodiment of the present invention, the C_SIZE field is updated to reflect the bad memory capacity information, which will be described in detail later in this disclosure.

The host device 100 sends a command requesting a CSD register value to the controller 210 when necessary. In response to the command, the controller 210 transmits the CSD register value to the host device 100.

The CPU 213 updates the memory capacity information according to the occurrence of a bad memory block and stores the updated memory capacity information in the CSD register. In addition, the CPU 213 sends the CSD register value to the host device 100 when a request for the memory capacity information is received from the host device 100. The memory capacity information stored in the CSD register is the available memory capacity information, which may be stored in the C_SIZE field (see FIG. 5) of the CSD register. The available memory capacity information indicates the memory capacity that is available for use by the host device 100.

An available memory capacity may be calculated using Equation (1):

$$\text{Available memory capacity} = \text{Total memory capacity} - \text{Unavailable memory capacity},$$

where, $$\text{Unavailable memory capacity} = \text{Controller allocation memory capacity} + \text{Bad memory capacity}$$

[Equation 1]

In accordance with exemplary embodiments of the present invention, bad memory capacity is the sum of a capacity of bad memory occurring when the memory card apparatus 200 is tested, i.e., during manufacturing, and a capacity of bad memory occurring during use, i.e., after being tested.

To calculate the available memory capacity that reflects the capacity of the bad memory occurring during the use, management of bad memory blocks is needed. When a bad memory block occurs, the CPU 213 marks the badness mark portion 310 corresponding to the bad memory block. In addition, the CPU 213 detects the position of a bad memory block and the number of bad memory blocks, calculates the bad memory capacity, and calculates the available memory capacity reflecting the calculated bad memory capacity. This information as to the position of bad memory block(s), number of bad memory block(s), and bad memory capacity, which is needed to manage bad memory blocks and update a memory capacity, is stored, for example, in a controller allocation memory block included in the memory unit 220 or the internal memory 215 included in the controller 210.

As shown in FIG. 2, the controller 210 includes the internal memories 215 and 217 to store programs and data. To store programs, the first internal memory 215 may be read-only memory (ROM), and more particularly, NOR type flash memory. The second internal memory 217 may be static random access memory (SRAM). In an exemplary embodiment of the present invention, the information needed to manage bad memory blocks and update a memory capacity is stored in the first internal memory 215, for example, to achieve fast access.

Figure 3:
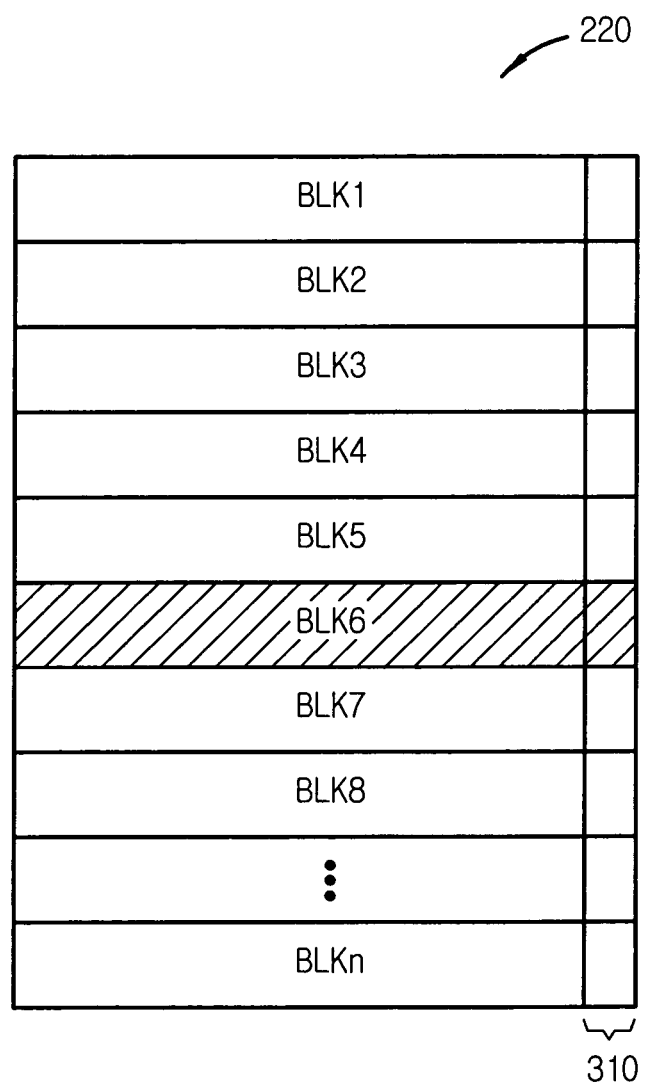
FIG. 3 illustrates the detailed structure of a memory unit shown in FIG. 1.
Figure 4:
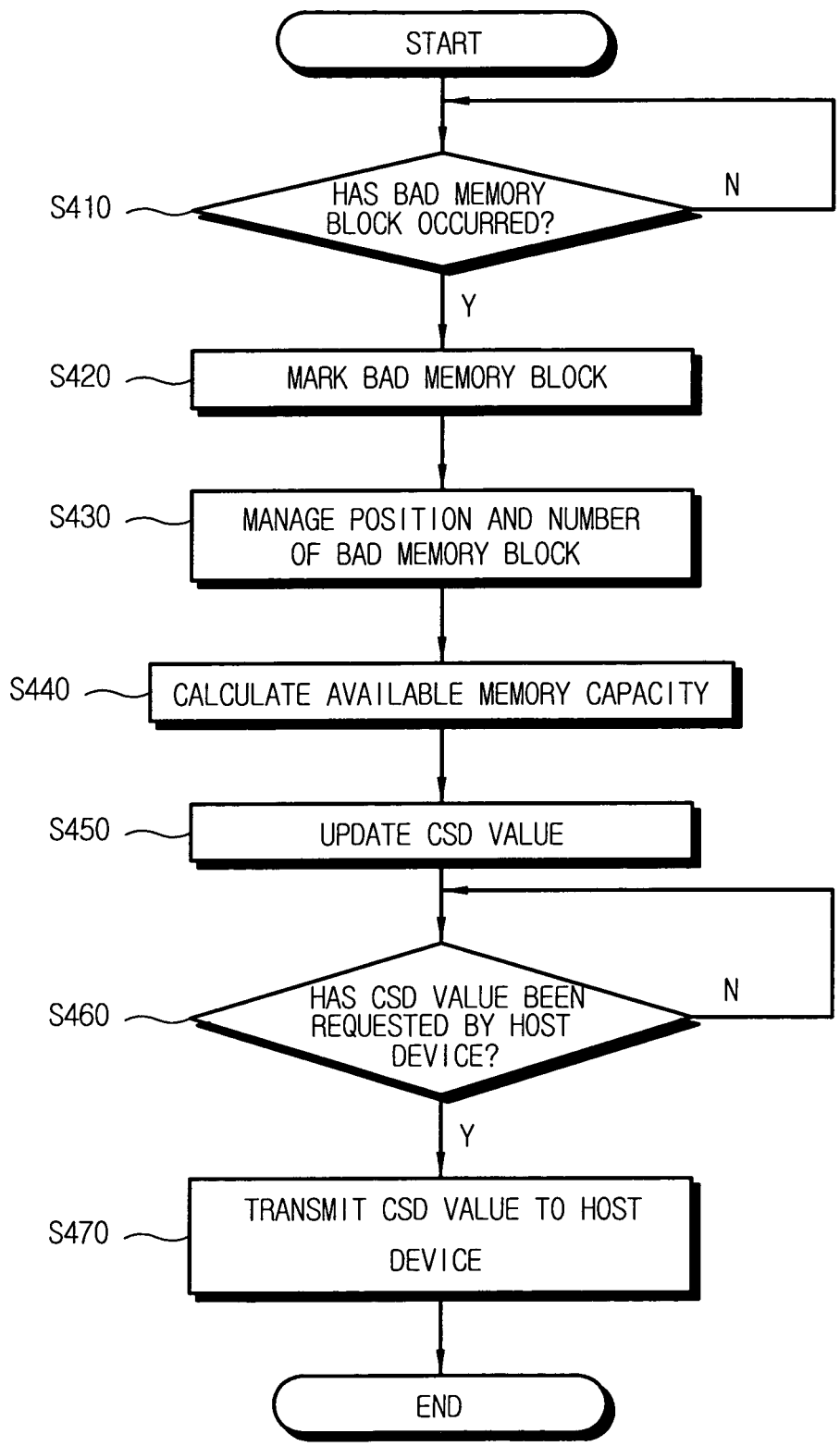
FIG. 4 is a flowchart of a method of updating memory capacity information according to an exemplary embodiment of the present invention.

FIG. 3 illustrates the detailed structure of the memory unit 220 shown in FIG. 1. FIG. 4 is a flowchart of a method of updating memory capacity information according to an exemplary embodiment of the present invention. Referring to FIG. 3, the memory unit 220 includes "n" memory blocks BLK1 through BLKn and the badness mark portion 310. It is assumed, for the purposes of explanation, that the fifth memory block BLK5 is a controller allocation memory block and the sixth memory block BLK6 has been bad since the testing of the memory card apparatus 200 at time of manufacture. In an exemplary embodiment of the present invention, the position and capacity of bad memory are managed in units of memory blocks. However, bad memory management may be performed in further subdivided units, e.g., pages, etc.

Hereinafter, a procedure in which the memory card apparatus 200 calculates a memory capacity and provides the calculated memory capacity to the host device 100, according to an exemplary embodiment of the present invention, will be described with reference to FIGS. 1 through 4.

Referring to FIG. 4, in a step S410, the CPU 213 checks whether a bad memory block has occurred in the memory unit 220. The CPU 213 marks the bad memory block, in a step S420. If, for example, the seventh memory block BLK7 is bad, the badness mark portion 310 corresponding thereto is marked to indicate that the seventh memory block BLK7 is bad. The seventh memory block BLK7 may correspond to a bad memory block occurring during use.

In a step S430, the position of the bad memory block and the number of bad memory blocks are detected and separately stored/managed. For example, position information of a new bad memory block is stored in a predetermined memory and the total number of bad memory blocks is updated and stored. If a new bad block is encountered, e.g., the seventh memory block BLK7, "1" is added to the number of bad memory blocks occurring during manufacturing. In this example, the total number of bad memory blocks will be updated with "2". When an additional bad memory block occurs during use, the bad memory block position and number information will be updated.

In a step S440, a bad memory block capacity is calculated from the number information of the bad memory block and an available memory capacity is calculated reflecting the calculated bad memory block capacity. For example, the bad memory block capacity may be the number information of the bad memory blocks or a value calculated using the number information of the bad memory blocks. The available memory capacity may be the number information of available memory blocks or a value calculated using the number information of the bad memory blocks. The calculated bad memory block capacity and available memory capacity may be separately stored and managed.

After the available memory capacity is updated, memory capacity information in a CSD register is updated in a step S460. When a command to transmit a CSD register value is received from the host device 100 in a step S460, the memory card apparatus 200 transmits the CSD register value to the host device 100 in a step S470.

Available memory capacity information is data indicating the available memory capacity. It may be the available memory capacity itself, the number of available memory blocks, or other values. For example, it is adequate if the available memory capacity information is data that allows the host device 100 to recognize or calculate the available memory capacity of the memory card apparatus 200. When the available memory capacity information is the number of available memory blocks, conceptually, the host device 100 can obtain the available memory capacity by multiplying the number of available memory blocks by the size of the memory blocks.

In an exemplary embodiment of the present invention, the available memory capacity information is contained in the CSD register and transmitted to the host device 100. Alternatively, bad memory capacity information may be contained in the CSD register and transmitted to the host device 100. In this case, the host device 100 calculates the available memory capacity of the memory card apparatus 200 using a predetermined calculation method such as Equation (1).

According to specifications, an MMC or SD card apparatus is designed to transmit capacity information of a memory card to the host device 100 through a CSD register. However, a memory card apparatus according to the conventional technology does not provide information on whether a bad memory block has occurred and information on a bad memory block capacity to the host device 100.

The memory card apparatus 200 according to an exemplary embodiment of the present invention, as described above, transmits memory capacity information reflecting a bad memory capacity occurring during use to the host device 100 through a CSD register. The memory capacity information reflecting the bad memory capacity may be stored in a C_SIZE field (i.e., a parameter indicating a total capacity of a memory card) or another field (e.g., an available memory capacity field or a bad memory capacity field) which is specially defined. It will be understood that the memory capacity information reflecting the bad memory capacity may be stored in any suitable field of the CSD register.

As described above, since the memory capacity information reflecting the bad memory capacity is provided to the host device 100, according to exemplary embodiments of the present invention, the host device 100 can recognize an actual available memory capacity of the memory card apparatus 200.

According to exemplary embodiments of the present invention, a memory card apparatus updates a bad memory block capacity according to the occurrence of bad memory blocks and continuously reflects the bad memory block capacity to memory capacity information in a CSD register, allowing a host device to recognize accurate information on a memory card.

Although the exemplary embodiments of the present invention have been described with reference to to the accompanying drawings for the purpose of illustration, it is to be understood that the that the inventive processes and apparatus are not be construed as limited thereby. It will be readily apparent those of ordinary skill in the art that various modifications to the foregoing exemplary embodiments may be made without departing from the scope of the invention as defined by the appended claims, with equivalents of the claims to be included therein.

What is claimed is:

1. A memory card apparatus comprising:
   a non-volatile memory; and
   a controller configured to control the non-volatile memory and to communicate with a host device,
   wherein the controller calculates memory capacity information of the non-volatile memory reflecting bad memory capacity information according to occurrence of bad memory in the non-volatile memory and updates available memory capacity information and transmits the updated available memory capacity information to the host device.

2. The memory card apparatus of claim 1, wherein the non-volatile memory is NAND type flash memory, and wherein the updated available memory capacity information is stored in a predetermined card-specific data (CSD) register included in the controller.

3. The memory card apparatus of claim 2, wherein the updated available memory capacity information is stored in a field indicating a total memory capacity, the field is included in the CSD register, and wherein the controller transmits a CSD register value to the host device in response to a command of the host device requesting the CSD register value.

4. The memory card apparatus of claim 3, wherein the available capacity information indicates a capacity obtained by subtracting a controller allocation memory capacity and a bad memory capacity from a total capacity of the NAND type flash memory.

5. The memory card apparatus of claim 4, wherein the bad memory capacity is a sum of an initial bad memory capacity existing since testing of the memory card apparatus and a bad memory capacity occurring during use after the testing.

6. The memory card apparatus of claim 1, wherein the memory card apparatus is a multimedia card (MMC) apparatus or a secure digital (SD) card apparatus.

7. A memory card apparatus comprising:
   a NAND type flash memory comprising a plurality of memory blocks; and
   a controller transmitting capacity information of the NAND type flash memory to a host device in response to a request of the host device,
   wherein the controller updates bad memory capacity information according to occurrence of bad memory block(s) in the NAND type flash memory and calculates the capacity information of the NAND type flash memory reflecting the bad memory capacity information.

8. The memory card apparatus of claim 7, wherein the capacity information of the NAND type flash memory is data indicting an available memory capacity obtained by subtracting an unavailable memory capacity from a total capacity of the NAND type flash memory, and wherein the unavailable memory capacity is a sum of a controller allocation memory capacity and a bad memory capacity.

9. The memory card apparatus of claim 8,
   wherein the controller comprises:
   a card-specific data (CSD) register storing capacity information of the NAND type flash memory; and
   a processor managing position and number information of the bad memory block(s) and calculating the bad memory capacity and the available memory capacity.

10. The memory card apparatus of claim 9, wherein the controller transmits a CSD register value to the host device in response to a command of the host device requesting the CSD register value, and wherein the host device calculates a capacity of the NAND type flash memory using the capacity information of the NAND type flash memory in the CSD register value.

11. The memory card apparatus of claim9, wherein the controller further comprises an internal memory to store the position and quantity information of the bad memory blocks and the bad memory capacity information.

12. The memory card apparatus of claim 10, wherein the internal memory is NOR type flash memory.

13. A method of updating memory capacity information of a non-volatile memory card apparatus, the method comprising:
   updating bad memory capacity information according to occurrence of bad memory blocks in a non-volatile memory included in the non-volatile memory card apparatus;
   calculating memory capacity information of the non-volatile memory reflecting the bad memory capacity information; and
   providing the memory capacity information of the non-volatile memory to a host device.

14. The method of claim 13, wherein the non-volatile memory is NAND type flash memory, and the calculating of the memory capacity information of the non-volatile memory comprises calculating an available memory capacity using total capacity information of the NAND type flash memory, controller allocation memory capacity information, and the bad memory capacity information.

15. The method of claim 14, wherein the providing of the memory capacity information to the host device comprises:
   updating a card-specific data (CSD) register value using the available memory capacity; and
   transmitting the CSD register value to the host device in response to a request of the host device.

16. The method of claim 14, wherein the updating of the bad memory capacity information comprises:
   determining whether bad memory blocks have occurred;
   if it is determined that the bad memory blocks have occurred, marking that relevant memory blocks are bad;
   storing position information of the bad memory blocks and number information of the bad memory blocks; and
   calculating the bad memory capacity information using the number information of the bad memory blocks.

17. A method of updating memory capacity information of a memory card apparatus including NAND type flash memory and a controller, the method comprising:
   updating bad memory capacity information according to occurrence of bad memory blocks in the NAND type flash memory;
   calculating capacity information of the NAND type flash memory using the updated bad memory capacity information;

updating a card-specific data (CSD) register value using the capacity information of the NAND type flash memory;

transmitting the updated CSD register value to the host device.

18. The method of claim 17, wherein the capacity information of the NAND type flash memory is data indicating an available memory capacity obtained by subtracting an unavailable memory capacity from a total capacity of the NAND type flash memory, and the unavailable memory capacity is a sum of a controller allocation memory capacity and a bad memory capacity.

19. The method of claim 18, wherein the bad memory capacity is a sum of an initial bad memory capacity existing since testing of the memory card apparatus and a bad memory capacity occurring during use after the testing.

20. A system for updating memory capacity, comprising:
a host device; and
a memory card apparatus connected to the host device, wherein the memory card apparatus comprises:
a non-volatile memory including a plurality of memory blocks; and
a controller calculating memory capacity information of the non-volatile memory reflecting bad memory capacity information according to occurrence of bad memory block(s) in the non-volatile memory and updating the memory capacity information of the non-volatile memory and transmitting the updated memory capacity information to the host in response to a request of the host device.

21. The system of claim 20, wherein the memory card apparatus is a multimedia card (MMC) apparatus or a secure digital (SD) card apparatus, and wherein the non-volatile memory is NAND type flash memory.

22. The system of claim 20, wherein the updated memory capacity information indicates a capacity obtained by subtracting a controller allocation memory capacity and a bad memory capacity from a total capacity of the non-volatile memory and is stored in a card-specific data (CSD) register included in the controller.

* * * * *